United States Patent
Hsue et al.

(10) Patent No.: US 6,502,702 B1
(45) Date of Patent: Jan. 7, 2003

(54) RACK CABINET AND METHOD FOR MAKING SAME

(75) Inventors: Eugene Yan Ki Hsue, San Jose, CA (US); Steve Sam Pulos, San Jose, CA (US)

(73) Assignee: 3PARdata, Inc., Fremont, CA (US)

( * ) Notice: Subject to any disclaimer, the term of this patent is extended or adjusted under 35 U.S.C. 154(b) by 0 days.

(21) Appl. No.: 09/990,117

(22) Filed: Nov. 21, 2001

(51) Int. Cl.[7] .................................................. A47F 5/00
(52) U.S. Cl. ........................ 211/26; 211/189; 312/265.4
(58) Field of Search ................ 211/26, 189; 312/223.2, 312/265.1, 265.2, 265.3, 265.4, 265.5, 265.6; 361/683

(56) References Cited

U.S. PATENT DOCUMENTS

| | | | |
|---|---|---|---|
| 4,274,547 A | * | 6/1981 | Takagi et al. |
| 4,553,674 A | * | 11/1985 | Yoshikawa et al. ........... 211/26 |
| 5,250,752 A | * | 10/1993 | Cutright .............. 312/265.4 X |
| 5,372,262 A | * | 12/1994 | Benson et al. ................. 211/26 |
| 5,743,607 A | * | 4/1998 | Teufel et al. ............. 312/265.2 |
| 6,135,583 A | * | 10/2000 | Simon et al. ........ 312/265.5 X |
| 6,174,034 B1 | * | 1/2001 | Benner et al. ............ 211/26 X |
| 6,238,029 B1 | * | 5/2001 | Marzec et al. ........... 312/265.3 |
| 6,240,687 B1 | * | 6/2001 | Chong ................. 312/265.4 X |
| 6,401,940 B1 | * | 6/2002 | Hartel et al. ................... 211/26 |
| 6,425,488 B1 | * | 7/2002 | Notohardiono et al. ....... 211/26 |

* cited by examiner

*Primary Examiner*—Robert W. Gibson, Jr.
(74) *Attorney, Agent, or Firm*—Skjerven Morrill LLP (57) ABSTRACT

A rack cabinet and a method for making such a rack cabinet are disclosed. In one embodiment, the rack cabinet includes a base member having alignment pins extending therefrom and a bracket having alignment holes, which mate with the alignment pins. One or more rails may then be secured to the bracket such that the rails are in proper, such as perpendicular, alignment with the base member. The bracket may be, for example, an L-shaped or a U-shaped bracket and provides structural strength to the rack cabinet in addition to properly aligning the rails relative to the base member. A top member may also be secured to top ends of the rails via brackets in a similar manner.

20 Claims, 5 Drawing Sheets

RACK CABINET AND METHOD FOR MAKING SAME

TECHNICAL FIELD

The present invention relates to a rack cabinet for mounting electronic devices therein.

BACKGROUND

Rack cabinets are commonly used to mount, secure, and house electronic devices, such as computer hardware. For example, computer servers, data storage devices, monitors, keyboards, and other electronic devices are commonly disposed in rack cabinets to permit such devices to be efficiently housed. Indeed, rack cabinets are particularly useful in applications where it is desirable, or necessary, to store multiple pieces of computer hardware equipment in a relatively small space. Rack cabinets generally save space, centralize resources, simplify service, simplify maintenance, and help organize a computing environment.

In a conventional rack cabinet, the various electronic devices, often referred to collectively as "rack mount equipment," are mounted within the rack cabinet in vertical relationship to one another, thus conserving valuable floor space. To further conserve floor space, it is often desirable to position multiple rack cabinets adjacent to one another in side-by-side fashion in order to provide a large amount of electronic device storage space while efficiently using available floor space.

Conventional rack cabinets are typically formed of welded members, such as sheet metal members, that comprise the rack. Welding is generally considered a specialized skill in the sheet metal industry, and requires a relatively skilled worker (i.e., a welder) to weld together the various rack cabinet members, thus increasing the cost associated with manufacturing such a rack cabinet. In addition, rack cabinets also typically require the use of fixtures during the welding process to maintain the proper relative positions, or alignment, of the various members while the members are being welded together. In particular, the fixtures are commonly needed to maintain base and rail members oriented perpendicular to each other during the welding operation. Use of such fixtures also adds time, and thus cost, to the assembly of such welded cabinets.

Welded rack cabinets are also usually difficult, or impossible, to rework if a defect, such as an assembly defect, is discovered after the rack cabinet is welded. Indeed, welded rack cabinets are not easily disassembled without destroying one or more rack cabinet members. Hence, welded rack cabinets are typically scrapped in their entirety where defects in such rack cabinets are discovered after the welding process is complete. Such scrapping of defective rack cabinets adds a cost of scrapped material for defective rack cabinets.

In addition, it is frequently desirable to increase the number of rack cabinets that can be arranged in side-by-side fashion in a given floor space, while maintaining a standard width for the inside of the rack cabinet. Thus, the more narrow the rack cabinets, the more rack cabinets may be positioned next to one another in a given area. However, conventional attempts to provide a narrow rack cabinet having a standard inside width have failed to produce a rack cabinet that is both narrow and highly rigid. Indeed, prior attempts to provide narrow rack cabinets have resulted in rack cabinets having low lateral rigidity.

Standards for rack cabinets are set forth by EIA (Electronic Industries Alliance) and IEC (International Electrotechnical Commission). In particular, the EIA-310 and IEC-297 standards relate to rack cabinets and are incorporated herein by reference.

Accordingly, a need exists for a rack cabinet that may be inexpensively manufactured. Another need exists for a rack cabinet that is narrow. Yet another need exists for a rack cabinet that has high lateral rigidity. An additional need exists for a rack cabinet that may be readily reworked.

SUMMARY

A rack cabinet and a method for making such a rack cabinet are provided. In one embodiment, the rack cabinet includes a base member having alignment pins extending therefrom and brackets having alignment holes, which mate with the alignment pins. Rails are secured to the brackets such that the rails are in proper, such as perpendicular, alignment with the base member. The brackets may be, for example, L-shaped or U-shaped brackets and provide structural strength and lateral rigidity to the rack cabinet in addition to properly aligning the rails relative to the base member. A top member may also be secured to the rails in a similar fashion.

Holes are formed in the rails to permit electronic devices, such as rack mount computer hardware, to be mounted within the cabinet between the rails. Fasteners are used to secure the electronic devices to the holes formed in the rails.

Fasteners may also be used to secure each bracket to the base member via corresponding holes formed in the bracket and the base member. Such fasteners may also be used to secure the rails to the corresponding brackets via corresponding holes formed in the bracket and the rails. Securing the brackets to the base member and to the rails using fasteners avoids the use of welding and the associated fixturing in assembling the rack cabinet, thus eliminating the need for welding the rails to the base member.

Accordingly, a rack cabinet is provided that is narrow and that has high lateral rigidity. In addition, the rack cabinet is inexpensive to manufacture and assemble due to not requiring welding or the associated fixturing. Moreover, the present rack cabinet may be readily reworked, or disassembled, by removing the various fasteners and brackets.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DESCRIPTION

FIGS. 1–5 illustrate details of a rack cabinet 100 in accordance with one embodiment of the present invention.

Figure 1:
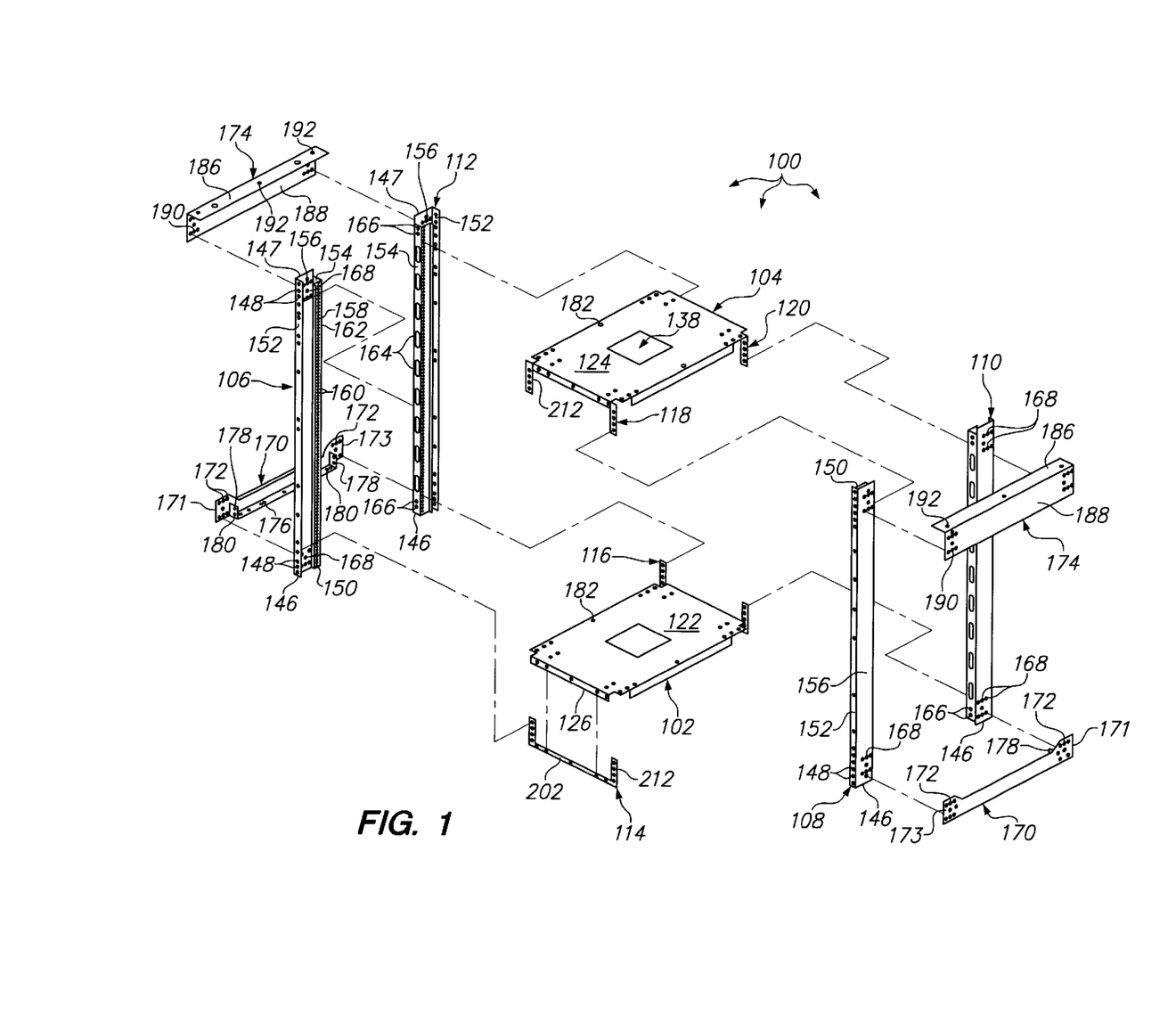
FIG. 1 is an exploded isometric view of a rack cabinet in accordance with one embodiment of the present invention.

As shown, the rack cabinet 100 includes a base member 102, a top member 104, and rails 106, 108, 110, and 112. U-shaped brackets 114 and 116 are mounted on the base member 102 and U-shaped brackets 118 and 120 are mounted on the top member 104. The rails 106 and 108 are secured to the U-shaped brackets 114 and 118. Similarly, the rails 110 and 112 are secured to the U-shaped brackets 116 and 120. The U-shaped brackets 114–120 align the rails 106–112 relative to the base member 102 and the top member 104 such that the longitudinal axes of the rails 106–112 are substantially parallel to each other and are substantially orthogonal to a first planar surface 122 of the base member 102 and a first planar surface 124 of the top member 104. The U-shaped brackets 114–120 also provide structural strength to the rack cabinet 100.

Figure 2:
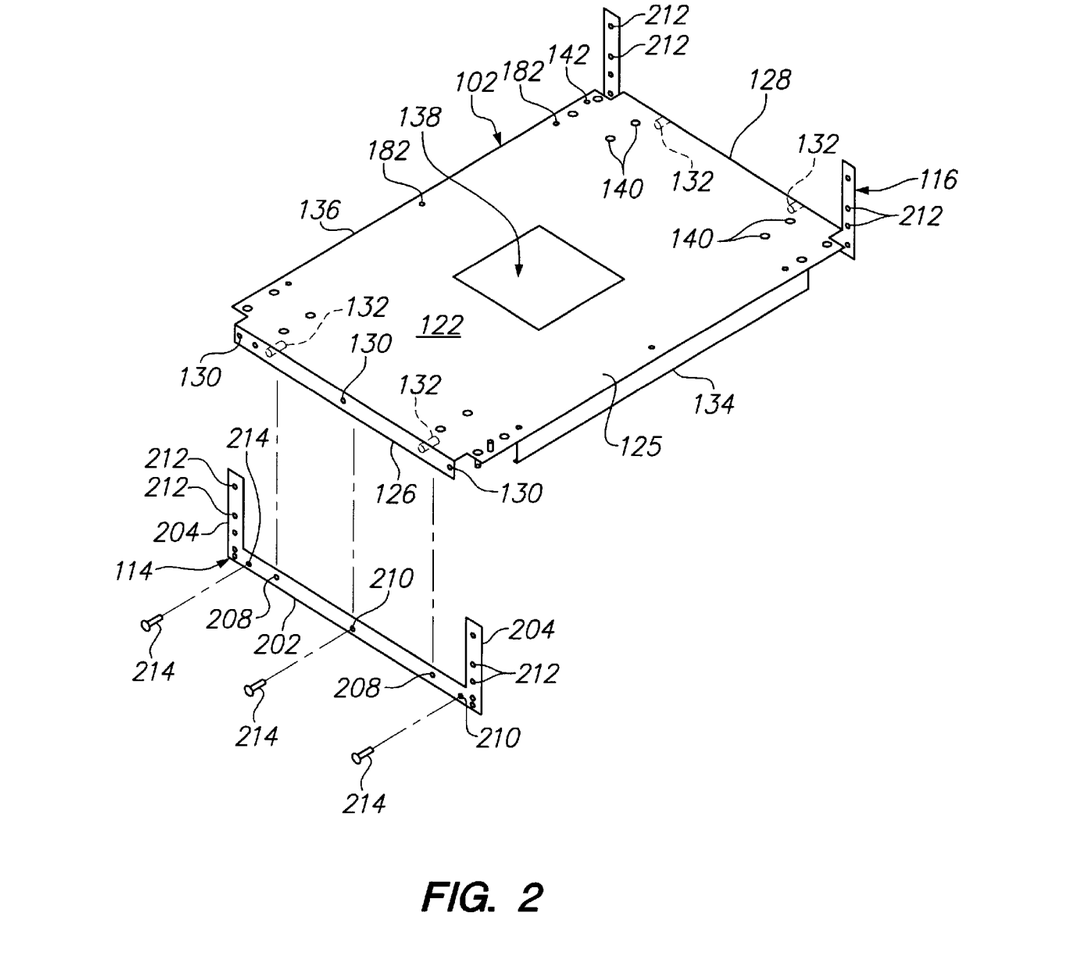
FIG. 2 is an exploded isometric view of a base member and brackets of the rack cabinet of FIG. 1.

As perhaps best illustrated in FIG. 2, the base member 102 may comprise a planar portion 125 and opposing first and second flanges 126, 128 disposed on opposing ends of the planar portion 125. The first and second flanges 126 and 128 of the base member 102 may be integrally formed with the central portion 125 and have flange holes 130 formed therein. The first and second flanges 126 and 128 also have alignment pins 132 (FIG. 5) extending therefrom.

In one embodiment, the alignment pins 132 (FIG. 5) comprise metal pins having a circular cross-sectional shape. The alignment pins 132 may have a length in the range of about 8–15 millimeters and may have a diameter of about 13 millimeters adjacent the first and second flanges 126, 128 and may taper to a smaller diameter at the end of the alignment pins 132 away from the first and second flanges 126, 128. The alignment pins 132, in one embodiment, are secured to the associated flange 126, 128 by swaging or other suitable technique. The alignment pins 132 are disposed beneath the planar portion 125 of the base member 102 opposite the first planar surface 122 of the base member 102 and are shown in dashed lines in FIG. 2.

Referring again to FIG. 2, the base member 102 may also have side flanges 134 and 136 disposed on opposing sides of the base member 102. In one embodiment, the base member 102 is formed of 12-gage sheet metal, which may be cut by a stamping operation and then bent to form the flanges 126, 128, 134, and 136. The holes 130 may be formed in the flanges 126, 128 during the stamping operation or in a second operation. A cable access hole 138 may be formed in a central portion of the base member 102 to accommodate passage of cables, wires, and the like through the cable access hole 138. As shown in FIG. 2, the cable access hole 138 may be optionally covered with a cover 139.

Holes 140 may also be formed in the planar portion 125 of the base member 102 to permit threaded studs (not shown) to be mounted on a bottom planar surface (not shown) of the base member 102 opposite the planar surface 122. The threaded studs, in turn, may be used for mounting casters, leveling feet, or both adjacent the bottom planar surface of the base member 102. A ground stud 142 may also be provided to electrically ground the rack cabinet 100 and to provide a source of grounding for electronic devices (not shown) mounted in the rack cabinet 100.

The U-shaped bracket 114, as shown in FIG. 2, comprises a central portion 202 and arm portions 204 formed at opposing ends of the central portion 202. The arm portions 204 are oriented parallel to each other and orthogonal, or perpendicular, to the central portion 202. In one embodiment, the U-shaped bracket 114 is formed from sheet metal having a thickness of about 0.6 centimeters. In another embodiment, the U-shaped bracket 114 is formed by welding together two U-shaped members (not shown) formed of 10-gage cold-rolled steel.

The central portion 202 of the U-shaped bracket 114 includes alignment holes 208 and fastening holes 210. The alignment holes 208 may be circular in cross-section and are sized to accommodate the alignment pins 132 therein in a "close-fit" manner. Thus, when the alignment pins 132 of the base member 102 are inserted into the alignment holes 208 of the U-shaped bracket 114, the arm portions 204 of the U-shaped bracket 114 are aligned in an orthogonal, or perpendicular, orientation relative to the first planar surface 122 of the base member 102.

After the U-shaped bracket 114 is mounted on, and aligned relative to, the base member 102 by inserting the alignment pins 132 into the alignment holes 208, fasteners 214 may be secured through the fastening holes 210 of the U-shaped bracket 114 and the holes 130 found in the flange 106. The fasteners 214 secure the U-shaped bracket 114 to the base member 102. The fasteners 214 may comprise any of a variety of suitable fasteners, including rivets, screws, bolts, and the like.

The arm portions 204 of the U-shaped bracket 114 also include fastening holes 212 for securing the arm portions 204 of the U-shaped bracket 114 with base end portions 146 of the rails 106 and 108. As shown in FIG. 1, the rail 106 includes holes 148 adjacent the base end portion 146 thereof and is secured to the U-shaped bracket 114 by securing fasteners (not shown) through the holes 148 and the fastening holes 212 of the U-shaped bracket 114.

The U-shaped brackets 116, 118, and 120 are identical to the U-shaped bracket 114 described above. The U-shaped bracket 116 is secured to the flange 128 in the same manner in which the U-shaped bracket 114 is secured to the flange 126. As shown in FIG. 1, however, the U-shaped brackets 114 and 116 are oriented in an opposite direction as the U-shaped brackets 118 and 120.

In addition, the rails 110 and 112 are identical to the rails 106 and 108. However, the rails 106 and 108 are oriented in an opposite orientation relative to the rails 110 and 112. Rails 110 and 112 are fastened to the U-shaped bracket 116 in the same manner in which the rails 106 and 108 are fastened to the U-shaped bracket 114.

Referring again to FIG. 1, the rail 106 is shown as having a cross-sectional shape that is substantially C-shaped, with an L-shaped member, including flanges 150 and 158, extending from an end thereof. In particular, the rail 106 includes opposing first and second side walls 152 and 154 joined by a central portion 156. The first and second side walls 152 and 154 are oriented parallel to each other and are generally orthogonal to the central portion 156. A flange 158 is formed integrally with and adjacent the second side wall 154, opposite and substantially parallel to the central portion 156. The flange 158 is oriented orthogonal to the second side wall 154. The first side wall 152, the central portion 156, and the second side wall 154, taken together, generally have a cross-sectional shape that is substantially C-shaped. The flange 150 extends from the flange 158 away from and orthogonal to the central portion 156. The flanges 150 and 158, taken together, are substantially L-shaped.

Holes 148 are formed in the first side wall 152 of the rail 106 adjacent the bottom end portion 146 of the rail 106 securing the bottom end portion 146 of the rail 106 to the holes 212 formed in the U-shaped bracket 114. Corresponding holes 148 are formed in the first side wall 152 of the rail 106 adjacent the top end portion 147 for securing the top end portion 147 of the rail 106 to the holes 212 formed in the U-shaped bracket 118.

Holes 160 are also formed in the flange 158 of the rail 106. As shown, the holes 160 are evenly spaced and are generally aligned relative to one another and are substantially centered between the flange 150 and the second side wall 154. The holes 160, in one embodiment, comprise tapped holes for receiving threaded fasteners (not shown) for securing electronic devices (not shown) within the rack cabinet 100 between the opposing rails 106 and 108. In one embodiment, L-shaped braces (not shown) are fastened to the rails 106 and 108 using the holes 160. Rack-mount electronic devices (not shown) are then placed on top of the L-shaped braces, which generally provide vertical support to the rack-mount electronic devices.

Holes 162 are formed in the flange 150 of the rail 106 for securing rack-mount electronic devices (not shown) to the rails 106 and 108. Securing the rack-mount electronic devices to the rails 106 and 108 generally limits, or prevents, movement of the rack-mount electronic devices relative to the rails 106 and 108 in a plane parallel with the first planar surface 122 of the base member 102.

Holes 164 and 166 are formed in the second side wall 154 of the rail 106. While the shape of the holes 164 may vary, the holes 164 are shown as comprising elongated slots having curved ends. The holes 166 are formed adjacent the bottom and top ends 146 and 147, respectively of the rail 106. The holes 166 are used in securing one of the bottom braces 170 to the rail 106 adjacent the base member 102, as discussed below.

The rail 106 also includes holes 168 formed in the central portion 156 adjacent the ends 146 and 147 of the rail 106. The holes 168 adjacent the base member 102 may be used in securing the bottom braces 170 to the rail 106. Similarly, the holes 168 adjacent the top member 104 may be used in securing the rail 106 to one of top braces 174.

The bottom braces 170 are used for rigidly coupling the rail 106 to the rail 112 and the rail 108 to the rail 110 adjacent the base member 104. As shown, each bottom brace 170 comprises an elongated member having ends 171 and 173. Holes 172 are formed adjacent to each of the ends 171 and 173. The holes 172 may be aligned with corresponding holes 168 formed in the rails 106–112 adjacent the base member 104 to permit the rails 106–112 to be secured to the associated bottom brace 170 by securing fasteners, such as a rivets, through the aligned holes 168 and 172.

The bottom braces 170 also each include a bottom flange 176 having opposing upward-facing arms 178. The bottom flange 176 has holes 180 formed therein to permit the bottom flange 176 to be secured to the base member 102. The bottom flange 176 may be secured to the base member 102 by aligning the holes 180 of the bottom flange with corresponding holes 182 formed in the base member 102 and securing fasteners (not shown), such as rivets, screws, or bolts, through the aligned holes 180 and 182.

The bottom flange 176 and the upward-facing arms 178, taken together, are substantially U-shaped and the upward-facing arms 178 are secured to the holes 166 formed in the second side wall 154 of the rails 106, 112. The upward facing arms 178 may be secured to the rails 106 and 112 by aligning the holes 180 formed in the arms 178 with the holes 166 formed in the rails 106, and 112 and securing fasteners (not shown), such as rivets, screws, or bolts, through the aligned holes 180 and 166.

Figure 3:
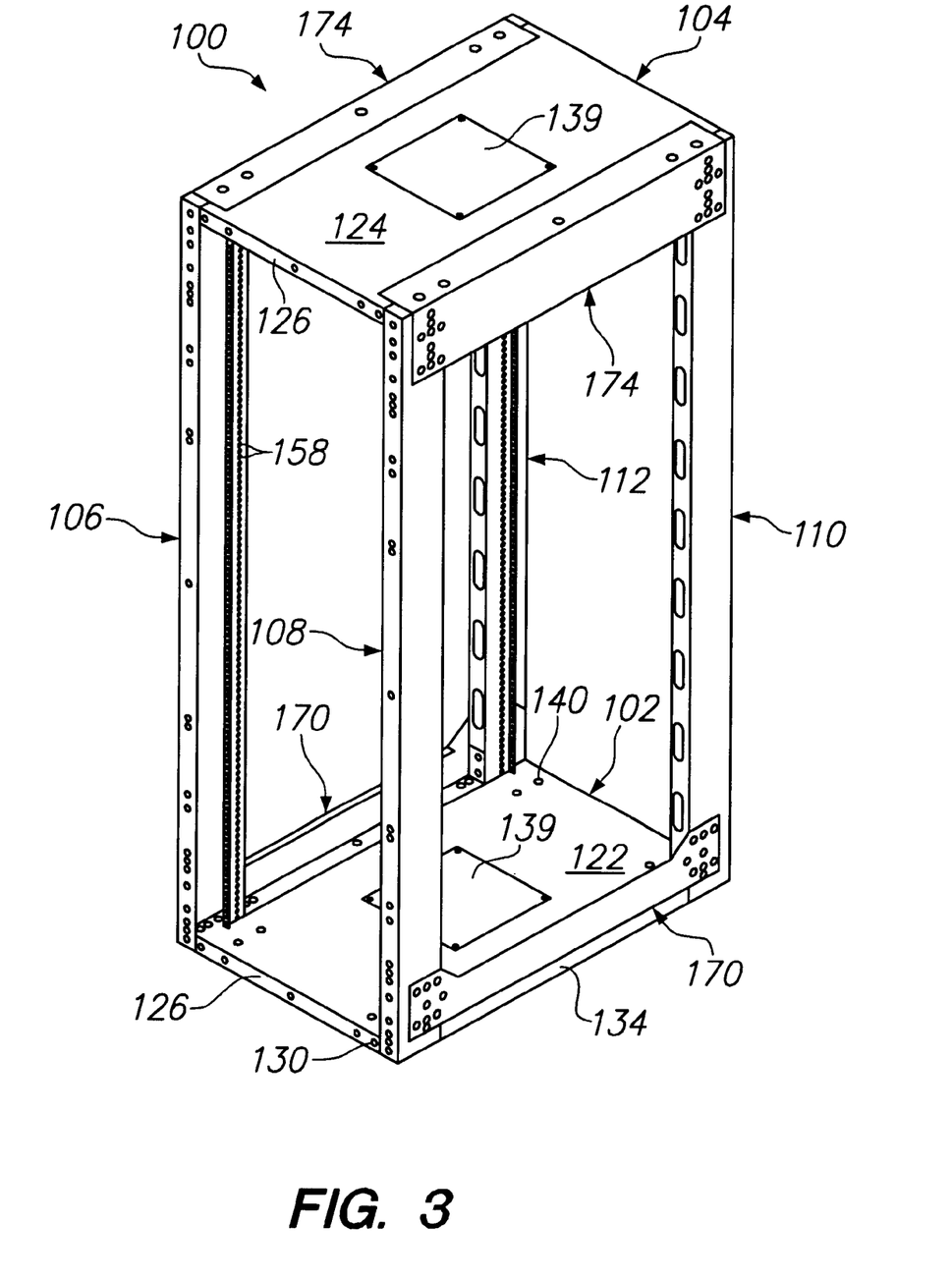
FIG. 3 is an isometric view of the rack cabinet of FIG. 1 in assembled form.
Figure 4:
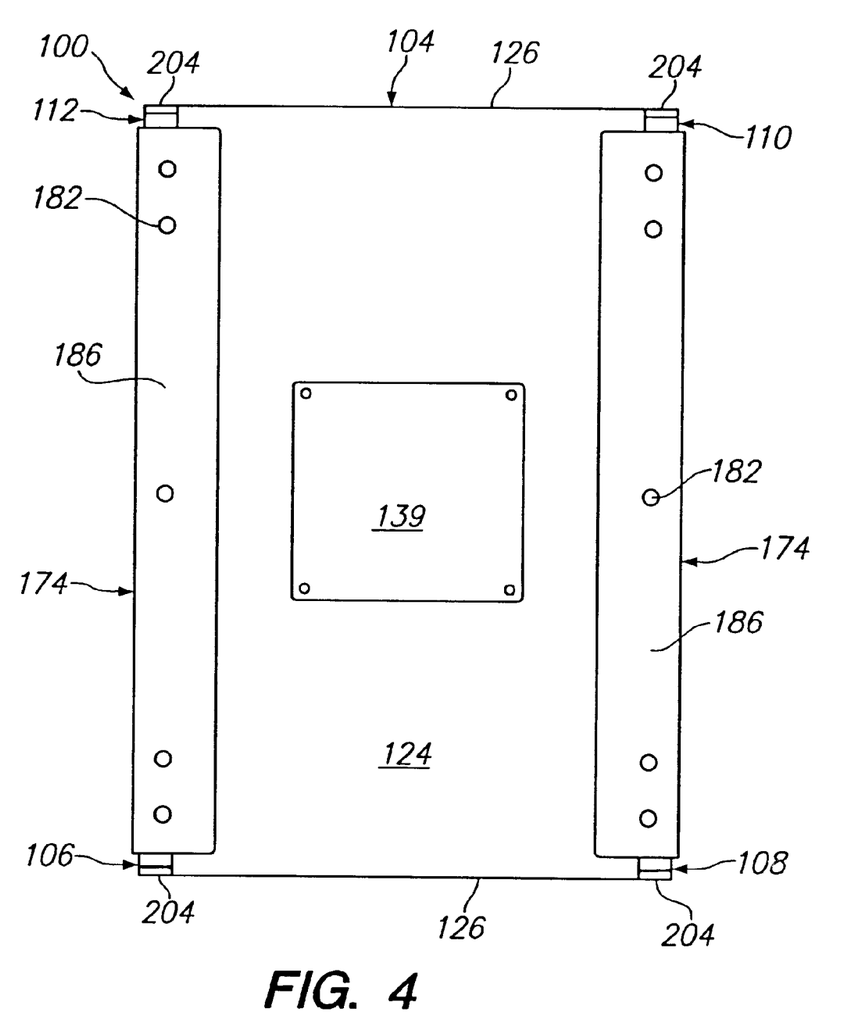
FIG. 4 is a top plan view of the rack cabinet of FIG. 1.
Figure 5:
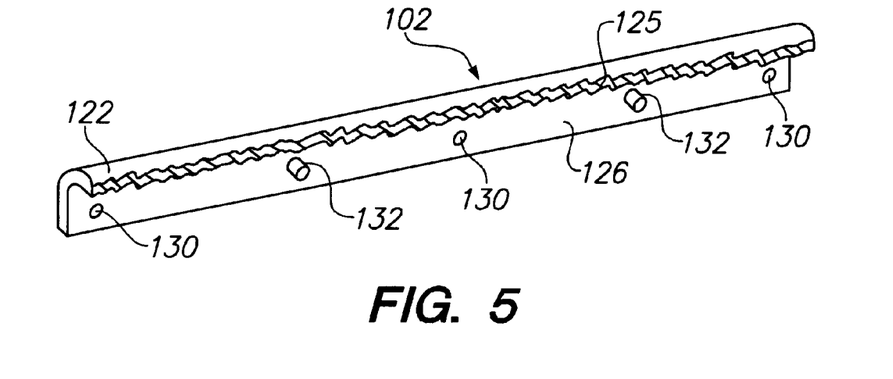
FIG. 5 is a breakaway isometric view of a portion of the FIG. 1 rack cabinet.

The top member 104 can be identical to the base member 102, except as follows. The top member 104 does not include the holes 140 or the ground stud 142. In addition, as shown in FIGS. 3–4, the cable access hole 138 of the top member 104 may be optionally covered with a plate 139. The top member 104 is oriented in the same direction as the base member 102.

As discussed above, the U-shaped brackets 118 and 120 are secured to the top member 104 and are oriented in a direction opposite the U-shaped brackets 114 and 116. In one embodiment, the arms 204 of the U-shaped brackets 114 and 116 point in a first, or upward, direction and the arms 204 of the U-shaped brackets 118 and 120 point in a second, opposite or downward direction. The rails 106–112 are secured to the U-shaped brackets 118, 120 in the same manner in which the rails 106–112 are secured to the U-shaped brackets 114, 116 as described above.

Top braces 174 are secured to the top member 104 and to corresponding rails 106–112. Each of the top braces 174 comprises an elongated member having first and second walls 186 and 188. The walls 186 and 188 may be integrally formed with each other and are oriented in an orthogonal, or perpendicular, relation to each other. The wall 188 has holes 190 formed therein adjacent the ends thereof. The wall 186 has holes 192 formed therein. The top braces 174 are secured to the top member 104 by aligning the holes 192 of the wall 186 with the holes 182 formed in the top member 104 and securing fasteners (not shown), such as rivets, bolts, or screws, through the holes 192 and 182. One of the top braces 174 is secured to the rails 106 and 112 by aligning the holes 190 formed in the wall 188 of the corresponding top brace 174 with the holes 168 formed in the rails 106 and 112 and securing fasteners (not shown), such as rivets, bolts, or screws, through the holes 190 and 168. The other of the top braces 174 is secured to the rails 108 and 110 by aligning the holes 190 formed in the wall 188 of the corresponding top brace 174 with holes 168 formed in the rails 108 and 110 and securing fasteners through the holes 190 and 168.

In one embodiment, the rack cabinet 100 comprises a rack cabinet for 19-inch rack mount devices. Pursuant to this embodiment, the rack cabinet 100 has an overall width (i.e., the outside dimension of the rails 106 and 108) of about 59.7 centimeters (about 23.5 inches) and an overall length (i.e., the outside dimension of the rails 106 and 112) of about 90.2 centimeters (about 35.5 inches).

Referring to FIG. 3, electronic devices (not shown), such as rack mount devices, may be mounted in the rack cabinet 100 by passing such devices either between the rails 106 and 108 or between the rails 110 and 112. The electronic devices may then be secured to the rails as described above.

Figure 6:
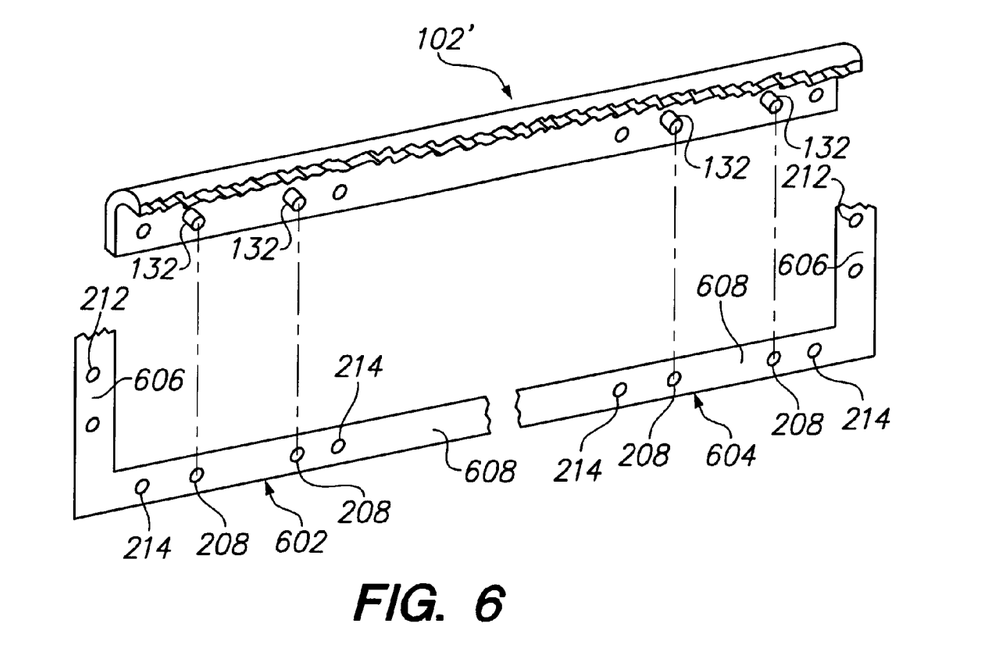
FIG. 6 is a breakaway isometric view of a portion of a rack cabinet in accordance with another embodiment of the present invention.

FIG. 6 illustrates an alternative embodiment of the present invention and includes base member 102' and a pair of L-shaped brackets 602 and 604. Pursuant to this embodiment, the L-shaped brackets 602 and 604 are used in the place of the U-shaped bracket 114 (FIG. 2) and the base member 102' is used in place of the base member 102.

The L-shaped bracket 602 comprises first and second arms 606 and 608, which are oriented perpendicular to each other and may be integrally formed as a single member. The first arm 606 of the L-shaped bracket 602 includes holes 212 similar to the holes 212 described above and are used to connect one of the rails 106–112 to the L-shaped bracket 602. The second arm 608 of the L-shaped bracket 602 includes holes 208 for mating with the alignment pins 132 extending from the base member 102' and holes 214 for securing the second arm 608 to the base member 102' via fasteners, such as the fasteners 214 (FIG. 2). The L-shaped bracket 604 can be identical to the L-shaped bracket 602, but is oriented opposite the L-shaped bracket 604, such that the first arms 606 of the L-shaped brackets 602 and 604 are positioned away from each other, on opposite ends of the base member 102.

The base member 102' is identical to the base member 102 shown in FIGS. 1–5, except as follows. The base member 102' includes at least two alignment pins 132 associated with the L-shaped bracket 602 and at least two alignment pins 132 associated with the L-shaped bracket 602. The L-shaped bracket 602 is mounted on the base member 102 by inserting a pair of alignment pins 132 through a pair of the holes 208 formed in the L-shaped bracket 602. With the alignment pins 132 positioned within the holes 208, the L-shaped bracket 602 is properly aligned with the base member 102'. A rail, such as the rail 106 (FIG. 1) may then be secured to the first arm 606 of the L-shaped bracket 602 by securing fasteners through the holes 212 of the L-shaped bracket 602 and holes 148 of the rail 106. The L-shaped bracket 604 is mounted on the base member 102' in the same manner in which the L-shaped bracket 602 is mounted on the base member 102'. Hence, in the embodiment illustrated in FIG. 6, the L-shaped brackets 602 and 606 are used instead of, and generally perform the same or similar function as, one of the U-shaped brackets 114–120 (FIG. 1). Rails 106 and 108 may then be secured to the first arms 606 of the L-shaped brackets 602, 604 in the same manner in which the rails 106 and 108 are secured to the arm portions 204 of the U-shaped bracket 114 as described above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A rack cabinet comprising:
   a base member having a base member hole formed therein;
   alignment pins extending from the base member;
   a first bracket having alignment holes and at least one fastening hole formed therein, the first bracket being mounted on the base member with the alignment pins disposed within the alignment holes of the first bracket;
   a fastener disposed through the fastening hole and the base member hole to fasten the first bracket to the base member;
   a first rail being fastened to the first bracket such that the first rail is oriented orthogonal to the base member.

2. The rack cabinet of claim 1, wherein the first bracket further comprises an L-shaped bracket.

3. The rack cabinet of claim 1, wherein the first bracket further comprises a U-shaped bracket.

4. The rack cabinet of claim 1, wherein the first bracket further comprises an L-shaped bracket and the base member further comprises base member holes formed therein, further comprising:
   a second bracket having alignment holes and a fastening hole formed therein, the second bracket being mounted on the base member with the alignment pins disposed within the alignment holes of the second bracket;
   a fastener disposed through a base member hole and the fastening hole of the second bracket to fasten the second bracket to the base member;
   a second rail being fastened to the second bracket such that the second rail is oriented orthogonal to the base member.

5. The rack cabinet of claim 4, wherein a top member is secured to the first and second rails.

6. A rack cabinet comprising:
   a base member having base member holes formed therein;
   alignment pins extending from the base member;
   a first U-shaped bracket having first and second sets of bracket holes formed therein, the first U-shaped bracket operable to be mounted on the base member with the alignment pins disposed within the first set of bracket holes;
   fasteners operable to be disposed through the second set of bracket holes and the base member holes to fasten the first U-shaped bracket to the base member;
   first and second rails having base and top ends, the base ends of the first and second rails operable to be fastened to the first U-shaped bracket such that the first and second rails are oriented orthogonal to the base member.

7. The rack cabinet according to claim 6, further comprising:
   a top member having top member holes formed therein;
   a plurality of alignment pins extending from the top member;
   a second U-shaped bracket having first and second sets of bracket holes formed therein, the second U-shaped bracket operable to be mounted on the top member with the alignment pins disposed within the first set of bracket holes;
   a plurality of fasteners operable to be disposed through the second set of bracket holes of the second U-shaped member and the top member holes to fasten the second U-shaped bracket to the top member;
   the top ends of the first and second rails operable to be fastened to the second U-shaped bracket such that the first and second rails are oriented orthogonal to the top member.

8. The rack cabinet of claim 6, wherein each of the alignment pins further comprises a proximal end operable to be secured to the base member and a distal end, the proximal end having a smaller diameter than the distal end.

9. The rack cabinet of claim 6, wherein the base member further comprises a planar first surface and a flange oriented perpendicular to the planar first surface, the alignment pins extending from the flange.

10. The rack cabinet of claim 6, wherein the base member further comprises a planar first surface, wherein each of the alignment pins comprises a longitudinal axis oriented parallel to the planar first surface.

11. The rack cabinet of claim 7, further comprising third and fourth rails operable to be secured between the base and top members via respective third and fourth U-shaped brackets.

12. The rack cabinet of claim 6, wherein the base member has first and second ends, wherein the alignment pins comprise a first set of alignment pins extending from the first end of the base member and the second set of alignment pins extending from the second end of the base member, the first U-shaped bracket operable to be mounted on the first set of alignment pins, further comprising a second U-shaped bracket operable to be mounted on the second set of alignment pins.

13. The rack cabinet of claim 12, further comprising third and fourth rails fastened to the second U-shaped member such that the third and fourth rails are orthogonal to a planar first surface of the base member.

14. A rack cabinet comprising:
a base member having opposing first and second ends, base member holes formed in the first and second ends of the base member;
alignment pins extending from the first end of the base member and alignment pins extending from the second end of the base member;
a first U-shaped bracket having first and second sets of bracket holes formed therein, the first U-shaped bracket being mounted on the base member with the alignment pins extending from the first end of the base member disposed within the first set of holes of the first U-shaped bracket;
a second U-shaped bracket having first and second sets of bracket holes formed therein, the second U-shaped bracket being mounted on the base member with the alignment pins extending from the second end of the base member disposed within the first set of holes of the second U-shaped bracket;
first fasteners disposed through the second set of bracket holes of the first U-shaped bracket and the base member holes to fasten the first U-shaped bracket to the base member;
second fasteners disposed through the second set of bracket holes of the second U-shaped bracket and the base member holes to fasten the second U-shaped bracket to the base member;
first and second rails having base and top ends, the base ends of the first and second rails being fastened to the first U-shaped member such that the first and second rails are oriented orthogonal to the base member;
third and fourth rails having base and top ends, the base ends of the third and fourth rails being fastened to the second U-shaped member such that the first and second rails are oriented orthogonal to the base member.

15. The rack cabinet of claim 14, further comprising a top member secured to the top ends of the first, second, third, and fourth rails.

16. The rack cabinet of claim 14, further comprising:
a top member having opposing first and second ends, a plurality of top member holes formed in the first and second ends;
alignment pins extending from the first end of the top member and a plurality of alignment pins extending from the second end of the top member;
a third U-shaped bracket having first and second sets of bracket holes formed therein, the third U-shaped bracket being mounted on the top member with the alignment pins extending from the first end of the top member disposed within the first set of holes of the third U-shaped bracket;
a fourth U-shaped bracket having first and second sets of bracket holes formed therein, the fourth U-shaped bracket being mounted on the top member with the alignment pins extending from the second end of the top member disposed within the first set of holes of the fourth U-shaped bracket;
third fasteners disposed through the second set of bracket holes of the third U-shaped bracket and the top member holes to fasten the third U-shaped bracket to the top member;
fourth fasteners disposed through the second set of bracket holes of the fourth U-shaped bracket and the base member holes to fasten the fourth U-shaped bracket to the base member;
the top ends of the first and second rails being fastened to the third U-shaped bracket;
the top ends of the third and fourth rails being fastened to the fourth U-shaped bracket.

17. The rack cabinet of claim 14, wherein the base member comprises a planar first surface and a pair of base flanges, the base flanges being positioned at the first and second ends of the base member and oriented orthogonal to the planar first surface.

18. A method of making a rack cabinet, the method comprising:
providing a base member having alignment pins extending from the base member and base member holes formed in the base member;
aligning a bracket relative to the base member by inserting the alignment pins into alignment holes formed in the bracket;
securing at least one rail to the bracket such that a longitudinal axis of the rail is oriented orthogonal to a first planar surface of the base member.

19. The method of claim 18, further comprising securing a fastener through a fastening hole formed in the bracket and a corresponding fastening hole formed in the base member.

20. The method of claim 18, wherein the bracket further comprises a U-shaped bracket or an L-shaped bracket.

* * * * *